United States Patent [19]

Nelson

[11] Patent Number: 5,553,238
[45] Date of Patent: Sep. 3, 1996

[54] POWERFAIL DURABLE NVRAM TESTING

[75] Inventor: Marvin D. Nelson, Boise, Id.

[73] Assignee: Hewlett-Packard Company, Palo Alto, Calif.

[21] Appl. No.: 376,322

[22] Filed: Jan. 19, 1995

[51] Int. Cl.$^6$ .......................... G06F 11/00; G11C 29/00
[52] U.S. Cl. ............................. 395/185.07; 395/185.05; 371/21.1
[58] Field of Search ........................... 395/575, 183.18, 395/185.07, 185.05; 371/21.1, 21.2, 21.3, 21.6; 365/200, 201

[56] References Cited

U.S. PATENT DOCUMENTS

| | | | |
|---|---|---|---|
| 4,727,544 | 2/1988 | Brunner et al. | 371/21.2 |
| 4,879,687 | 11/1989 | Okamoto et al. | 365/200 |
| 5,070,502 | 12/1991 | Supnik | 371/10.2 |
| 5,155,835 | 10/1992 | Belsan | 395/425 |
| 5,195,096 | 3/1993 | Moore | 371/21.1 |
| 5,195,100 | 3/1993 | Katz et al. | 371/66 |
| 5,237,658 | 8/1993 | Walker et al. | 395/200 |
| 5,239,509 | 8/1993 | Ikawa et al. | 371/21.1 |
| 5,278,838 | 1/1994 | Ng et al. | 371/10.1 |
| 5,287,462 | 2/1994 | Jibbe et al. | 395/275 |
| 5,289,418 | 2/1994 | Youngerth | 365/201 |
| 5,297,258 | 3/1994 | Hale et al. | 395/275 |
| 5,327,363 | 7/1994 | Akiyama | 371/21.1 |
| 5,371,868 | 12/1994 | Koning et al. | 395/400 |
| 5,396,619 | 3/1995 | Walton | 395/575 |
| 5,402,380 | 3/1995 | Kumakura et al. | 365/201 |

*Primary Examiner*—Robert W. Beausoliel, Jr.
*Assistant Examiner*—Joseph E. Palys
*Attorney, Agent, or Firm*—Lane R. Simmons

[57] ABSTRACT

Powerfail durable non-volatile random access memory (NVRAM) testing is provided by using the available NVRAM itself to remember its own state of testing, by sequencing through the testing process, and by carefully placing memory image checksums within the NVRAM. The correctness of the NVRAM image is maintained while each memory word is tested for functional correctness without additional or specialized hardware. NVRAM is manipulated such that it can detect disrupted testing and restore the NVRAM image as it existed prior to the disruption. Specifically, test variables are kept in the NVRAM itself to retain and manipulate (1) a test-status signal indicative of a status of the memory testing process, (2) data from the memory location being tested, (3) an address for the memory location being tested, and (4) checksums for verifying the accuracy of the data after the memory is tested. These carefully placed control sequences (checksums) allow for detection of numerous hardware corruptions that could potentially occur during the testing process.

14 Claims, 4 Drawing Sheets

POWERFAIL DURABLE NVRAM TESTING

FIELD OF THE INVENTION

This invention relates, in general, to semiconductor devices and, more particularly, to a method for testing a semiconductor memory device while preserving a memory image.

BACKGROUND OF THE INVENTION

The functional correctness of semiconductor memory devices is extremely important in computer technology. Accordingly, a memory device is tested often throughout its life in order to reduce the possibility of unexpected failure at a critical moment. Specifically, the overall goal of memory testing is to insure that the memory holds a variety of patterns and to insure that the address of each location is unique and correct.

It is difficult to maintain image (data) correctness stored in a non-volatile random access memory (NVRAM) when a disruption of testing activity occurs during the testing process. However, a complete and accurate image must be maintained even if power fails or the test is interrupted. The goal of retaining the image is particularly important since it may contain cached data that has not been stored on hardened media.

Generally, in prior art systems, the RAM is either left not tested or is left subject to potential data loss or corruption if a disruption occurs during testing. Therefore, to overcome the potential for data loss or corruption (i.e., to protect the memory image) during testing, some systems use multiple banks of NVRAM to hold the image of one of the banks being tested. However, this use of extra hardware components (additional NVRAM) increases the cost of the system.

Other systems copy the memory image to an available register memory such as typically exists in a microprocessor. However, in the event of a powerfail, the register memory is susceptible to data loss unless it is non-volatile, which increases the cost of the device.

Accordingly, objects of the present invention are to provide a cost-effective method for providing powerfail durable NVRAM testing without the need for additional memory banks or other specialized hardware.

SUMMARY OF THE INVENTION

According to principles of the present invention in its preferred embodiment, powerfail durable NVRAM testing is provided by using the available NVRAM itself to remember its own state of testing, by sequencing through the testing process, and by carefully placing memory image checksums within the NVRAM. The correctness of the NVRAM image is maintained while each memory word is tested for functional correctness without additional or specialized hardware.

According to further principles of the present invention, NVRAM is manipulated such that it can detect disrupted testing and restore the NVRAM image as it existed prior to the disruption. Specifically, control variables are kept in the NVRAM itself to retain and manipulate (1) a test-status signal indicative of a status of the memory testing process, (2) data from the memory location being tested, (3) an address for the memory location being tested, and (4) checksums for verifying the accuracy of the data after the memory is tested. These carefully placed control sequences (checksums) allow for detection of numerous hardware corruptions that could potentially occur during the testing process.

Other objects, advantages, and capabilities of the present invention will become more apparent as the description proceeds.

DETAILED DESCRIPTION OF THE INVENTION

Figure 1:
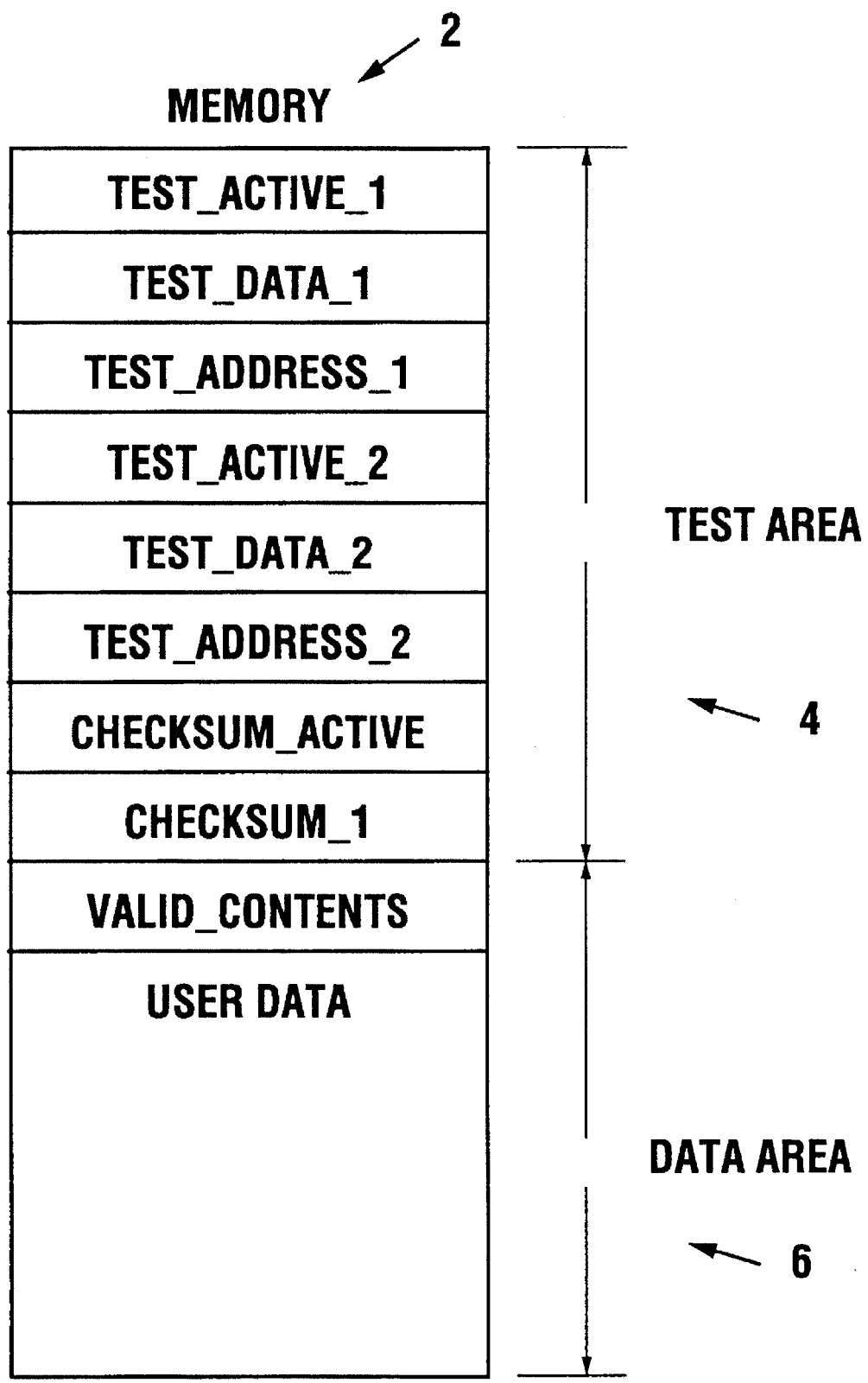
FIG. 1 is a block diagram representative of an NVRAM memory map showing the layout of test and data areas used for providing powerfail durable testing of the NVRAM according to the present invention.

FIG. 1 is a block diagram representative of an NVRAM memory 2 showing the layout of test and data areas 4 and 6 for providing powerfail durable testing of the NVRAM according to the present invention. NVRAM 2 includes a plurality of storage locations within test and data areas 4 and 6. Test and data areas 4 and 6 can be referred to as reserved subsets of the plurality of storage locations. For this discussion, data area 6 is referred to as the first subset. This first subset of storage locations comprises, essentially, all target locations reserved for user data. In contrast, the second subset (test area 4) comprises all test locations reserved for providing the powerfail durable testing of the NVRAM target locations. In this example, some locations within the subsets are referenced with a label for ease of discussion purposes, such as test_active_1, test_data_1, test_address_1, etc., but as common in the art, it is understood that any labeling convention may be used. Furthermore, for simplicity purposes, not all memory locations within the subsets are shown.

Figure 2:
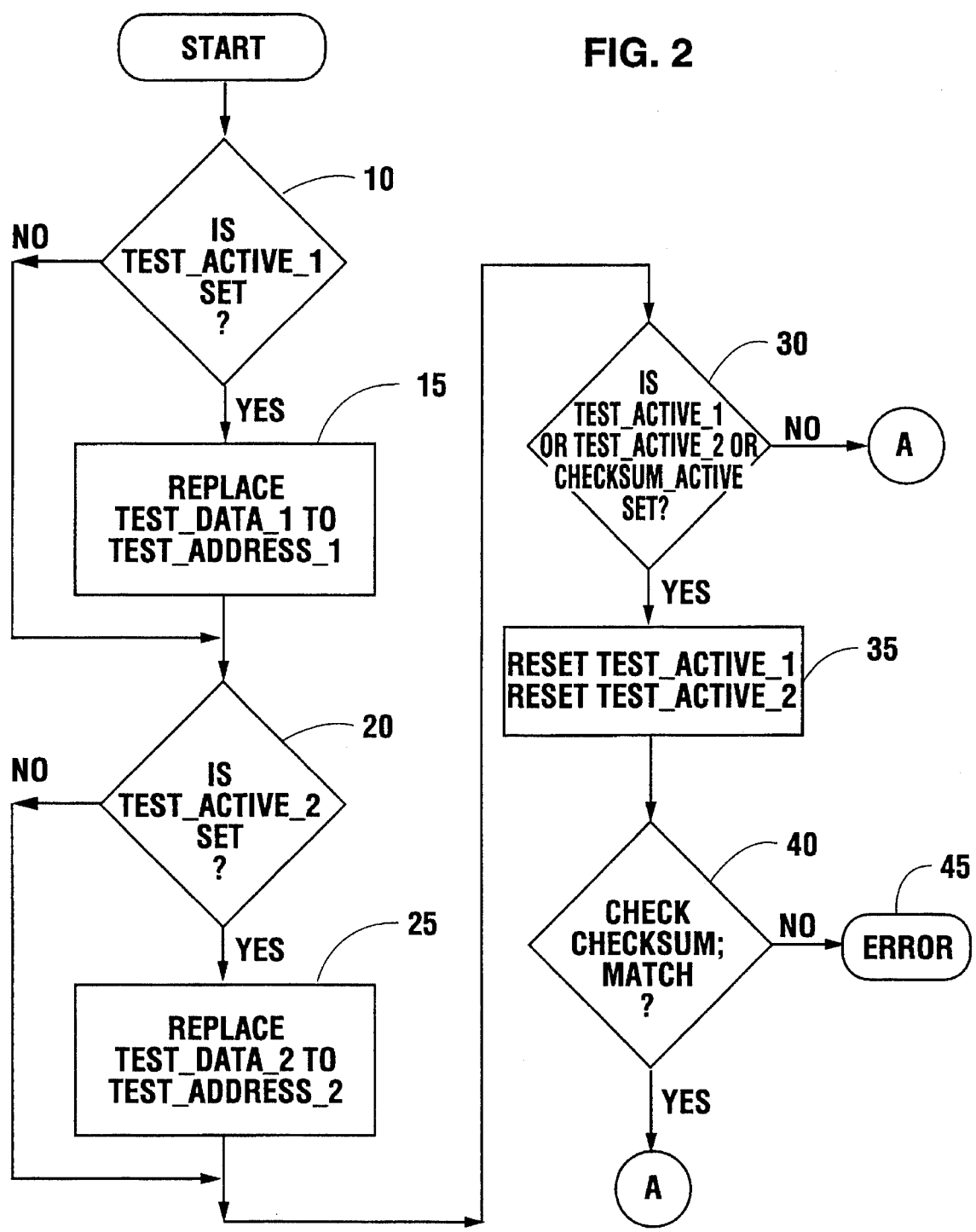
FIGS. 2–4 are flow charts depicting the method of the present invention for providing powerfail durable testing of NVRAM.
Figure 3:
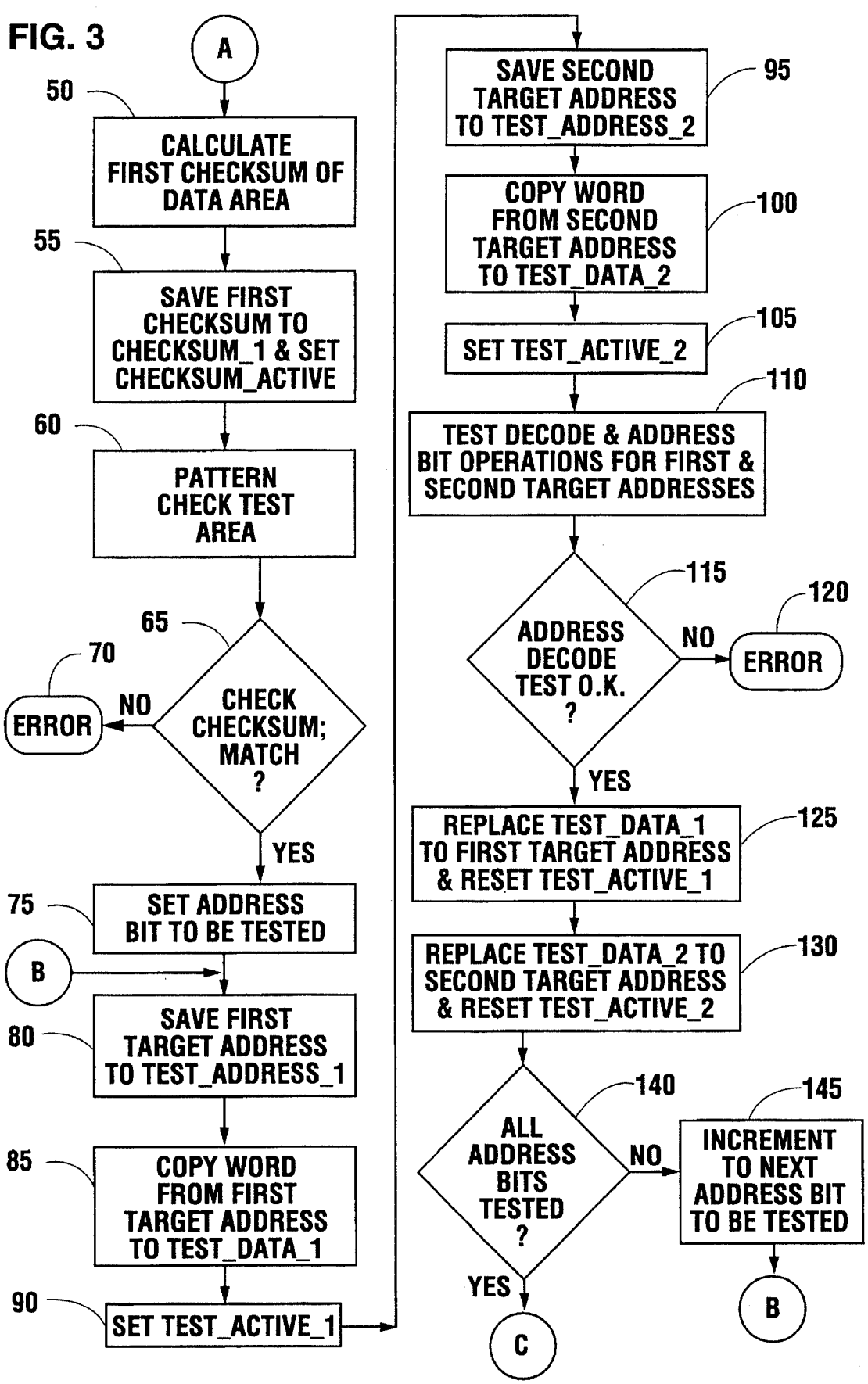
Figure 4:
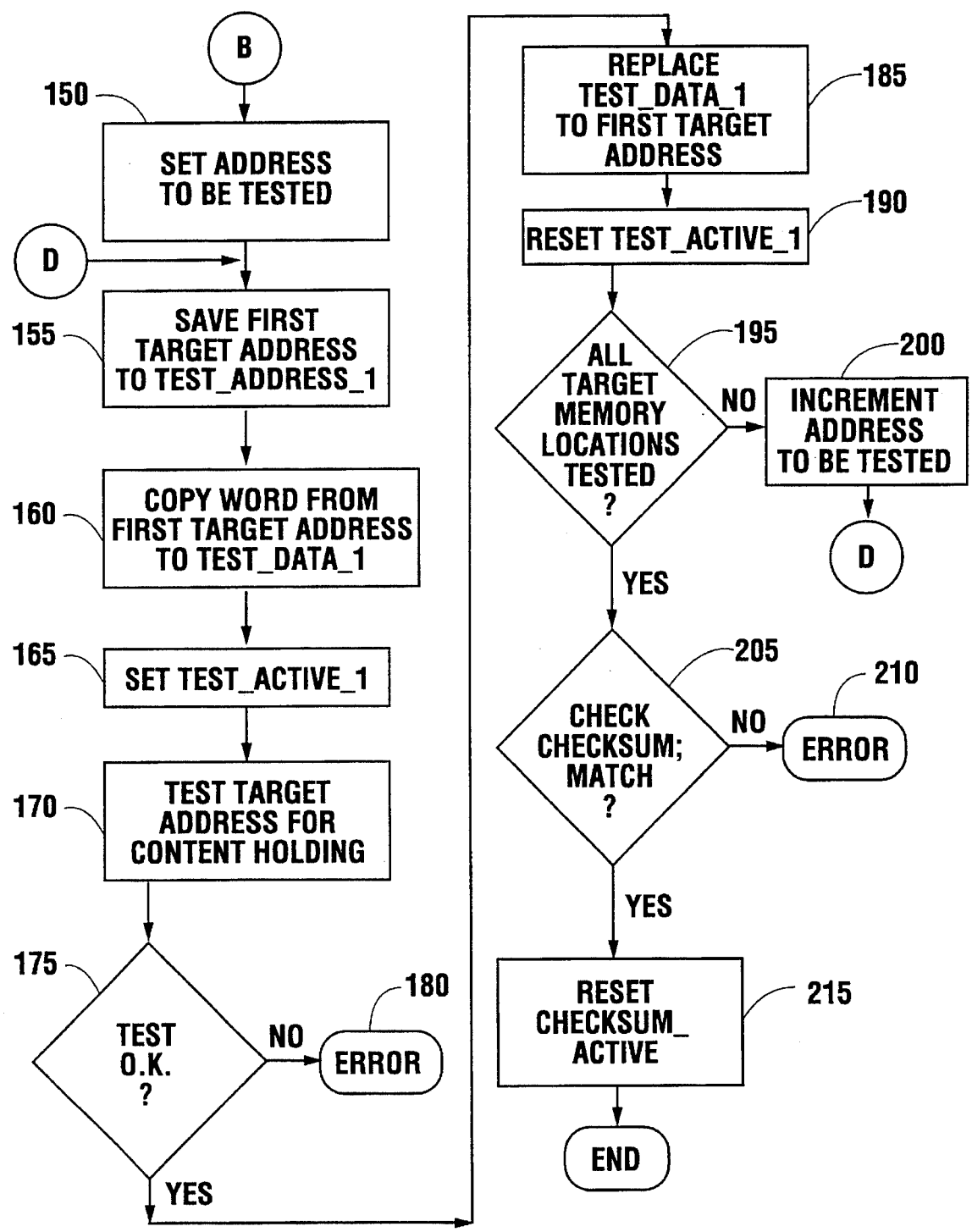

The method of testing the subsets and using the reserved, defined memory locations under principles of the invention will be more fully described in reference to FIGS. 2–4. However, the reserved, labeled FIG. 1 memory locations represent the following:

Test_Active_1 is used to hold a predefined word indicative of a test-status of a target location being tested in data area 6. This test-status signal is "set" when actual target location testing is ready to begin and remains set during testing. The test-status signal is "reset" upon completion of testing of the target location. In the preferred embodiment, the test-status signal is a predefined word pattern written to test_active_1. Although a single bit signal could serve as the test-status signal, a full word pattern is more reliable. However, for this discussion, a logical 0 will represent a "reset" state, and a logical 1 a "set" state for the test-status signal.

Test_Data_1 is used to hold a word of data as copied from the target location being tested in data area 6. The data is saved in test_data_1 during testing of the target location and then restored to the target location upon completion of testing.

Test_Address_1 is used to hold the address of the target location being tested in data area 6. The address is saved in test_address_1 during testing of the target location, and then used to restore the data in test_data_1 to the target location upon completion of testing.

Test_Active_1, Test_Data_1, and Test_Address_1 are used during address decode testing of certain target locations in data area 6 and during content testing of all target locations in data area 6 as will be more fully explained in reference to FIGS. 2–4.

$Test_{13}$ Active_2, Test_Data_2, and Test_Address_2 are similar to Test_Active_1, Test_Data_1, and Test_Address_1. However, this second set of reserved locations are used (in conjunction with the first set) for address decode testing of NVRAM 2 as will be more fully explained in reference to FIGS. 2–4.

Checksum_Active is used to hold a predefined word indicative of a validity status of a checksum calculated over data area 6.

Checksum_1 is used to hold a checksum value as calculated over data area 6. Checksum_1 is used as a reference after testing of the NVRAM to determine whether any data has been corrupted during testing.

Valid_Contents is used to hold a predefined word indicative of a validity status of the memory image in data area 6. This valid contents status signal is used as a further verification that the contents of area 6 does or does not have valid contents and does or does not need to be initialized, i.e., set to having valid contents. Furthermore, it allows for the results of any test process to be communicated to the remainder of the system functions.

User Data is simply indicative of the plurality of memory locations (all are not shown) used for holding user data.

FIGS. 2–4, more clearly describe the method of the present invention for providing powerfail durable testing of NVRAM 2. First, in reference to FIG. 2, the flow chart shows the events that occur on each power up of NVRAM 2 whereby it is determined whether the memory image has been corrupted from a previous testing process and/or whether it is repairable.

To begin with, the first test-status signal (test_active_1) is checked 10 to determine if it is set. If it is set, it indicates that a previous testing of the NVRAM was disrupted, such as by a powerfail. If it is reset, it indicates that a previous testing of the NVRAM was completed properly.

If test_active_1 is set, then the data image in data area 6 must be restored to its original state prior to the disruption. Accordingly, the data saved in test_data_1 is restored 15 to its target location address as identified by the address saved in test_address_1. In contrast, if the test-status signal is reset (i.e., a logical 0), then NVRAM powerup is able to proceed without attempting to repair the image because no previous testing was disrupted during testing of the target location identified in test_address_1.

Next, the test-status signal for test_active_2 is checked 20 to determine if it is set. If it is, then the data saved in test_data_2 is restored to the appropriate target address as identified in test_address_2. Otherwise, if this second test-status signal is not set, powerup is able to proceed without attempting to repair the image because no previous testing was disrupted during testing of the target location identified in test_address_2.

Subsequently, 30, test_active_1 is checked along with test_active_2 and checksum_active. If either of these are set, then an error may have occurred somewhere at sometime. Therefore, the test_active locations are reset 35 and the first checksum_1 is checked 40 to verify if any NVRAM data is actually corrupted. Specifically, a new checksum is built (calculated) and compared against the first checksum that was previously calculated and stored in test location checksum_1. If the newly calculated checksum matches the first checksum, then the present NVRAM powerup continues properly. In contrast, if the checksums do not match, then an error has occurred 45 (the data has been corrupted somehow), and appropriate error handling occurs. Throughout this invention, in all cases where a newly calculated checksum is compared to checksum_1 and a match does not exist, then appropriate error handling occurs. Specifically, everything possible is done to restore the original image from which the first checksum_1 was calculated and/or to verify that the original image is still present.

Referring now to FIG. 3, the steps for actual testing of test area 4 of NVRAM 2 are shown, along with the steps for address decode testing of NVRAM 2. A first checksum is calculated 50 for the entire data area 6 and then saved 55 in location checksum_1 of test area 4. The actual method of calculating the checksum is not pertinent to this invention but may be any method commonly known in the art. After the first checksum has been calculated and saved 50, 55, checksum_active is set. Namely, a predefined pattern is written to test location checksum_active to indicate that the value in checksum_1 is valid.

This first checksum is used as a reference after testing of the NVRAM to determine whether any data has been corrupted during testing. Specifically, after a subset of memory locations are tested, a new checksum is calculated over the same data area 6 and then compared against the first checksum saved in checksum_1. If a match exists, no error occurred during testing. Otherwise, if no match exists, an error occurred and appropriate error handling occurs as previously discussed.

After the first checksum is saved, test area 4 is pattern check tested 60. Patterns are written to test area 4 to make sure that the test locations will properly hold target location data from data area 6 during testing of that data area. However, test locations checksum_1 and checksum_active are not pattern tested in order to save the first checksum previously stored therein as a reference for the image validity of NVRAM 2. However, checksum_active and checksum_1 are each polled at various intervals for some time period to determine if each holds its contents appropriately. Accordingly, their status is checked first, and no further NVRAM writes are performed until it is certain that they correctly hold their contents.

After the test area is pattern tested (except for checksum_1 and checksum_active), a new checksum is calculated 65 and compared to the first checksum stored in checksum_1. If a match exists, the data image remains valid. Otherwise, if a match does not exist, the data image was corrupted and appropriate error handling occurs 70.

Next, address decode testing is performed on NVRAM 2. For address decode testing, each address bit is tested by writing to the location identified by that address bit being set, and making sure that the location written to is accurate relative to the address identified by the bit not being set. For example, if only four address lines (0000) were used, then address 0000 would be tested relative to address 0001 by writing to each location and making sure that such occurred correctly. Then, address 0010 would be tested relative to address 0000, then 0100 relative to 0000, then 1000 relative to 0000. As such, all address bits are tested for decoding operations.

Accordingly, in reference again to FIG. 3, the first step under the present invention is to set a first address bit to be tested 75 whereby a first target address is identified. Then, the first target address is saved 80 into test_address_1 of test area 4, and the word of data associated with that first target address is copied 85 into test_data_1 of test area 4. The target location data and address are saved prior to performing any testing on the target location to be sure no data is corrupted prior to actual testing. The data and address remain saved in these test locations during testing of the target location. Then, once the data and address are saved, the test-status signal test_active_1 is set 90 to indicate the data is saved and testing can occur.

Similar to saving the address and data of the first target address, the address and data of the second target address are saved 95 and 100 into test_address_2 and test_data_2, and test_active_2 is set 105. Now, decode and address bit testing of these address bits which identify the first and second target address locations can occur 110. Namely, patterns are written to and read from the first and second target locations in a manner such that it can be determined that the address bit and decode operations perform properly, i.e., that the address of each test location is unique and correct. If an error is detected 115 and 120, then appropriate error handling occurs. Otherwise, if no error is detected, processing continues and the data from test_data_1 and test_data_2 are replaced to their appropriate target address locations 125 and 130 as identified, respectively, by test_address_1 and test_address_2. Furthermore, test_active_1 and test_active_2 are reset to indicate that testing has completed properly for those particular target locations.

If not all address bits have been tested 140, then the cycle is repeated. Namely, we increment the address to the next address bit to be tested and repeat steps 80 through 145 as necessary and appropriate. On the other hand, if all address bits have been tested, the NVRAM testing continues on.

FIG. 4 depicts the method for continued NVRAM testing whereby all target locations in data area 6 are tested to determine that they correctly hold data. Accordingly, the address to be tested is set 150 to a first target address location. Then, similar to the steps of FIG. 3, the first target address is saved to test_address_1, the word is copied 160 from the target location to test_data_1, and test_active_1 is set 165. Since each target location in data area 6 of NVRAM 2 is checked sequentially for content holding capability, and not relative to another target address, the second set of test locations (test_active_2, test_address_2, and test_data_2) are not used.

For testing purposes of the target location, another series of write and read tests are performed to be sure that the target location is able to hold data appropriately 170. Then, if an error is detected during testing 175 and 180, appropriate error handling occurs. In contrast, again, if testing proved successful 185, the data is replaced from test_data_1 to the target location as recognized by the address saved in test_address_1. Furthermore, test_active_1 is reset 190 to indicate testing has completed.

Similar to the address decode testing, if not all data area 6 memory locations have been tested 195, the process is repeated by incrementing the target address to be tested 200, and repeating steps 155 through 200 as necessary and appropriate until all target locations have been tested.

Upon completion of testing 195, a new checksum is calculated 205 for data area 6 and compared to the first checksum saved in checksum_1 to determine whether the memory image was corrupted during testing. As before, if the checksums do not match, an error occurred and appropriate error handling 210 is taken. Otherwise, if the checksums match, the checksum_active test-status signal is reset 215, and NVRAM testing is complete.

Finally, the testing methods described herein include address decode bit testing, and content holding testing for the memory locations at issue. Although these types of testing are important, it is obvious to those of ordinary skill in the art that other memory verification tests may also be used.

What has been described above are the preferred embodiments for a method of providing powerfail durable NVRAM testing without the need for separate banks of memory or other special hardware. It will be obvious to one of ordinary skill in the art that the present invention is easily implemented utilizing any of a variety of hardware and software tools existing in the art. While the present invention has been described by reference to specific embodiments, it will be obvious that other alternative embodiments and methods of implementation or modification may be employed without departing from the true spirit and scope of the invention.

What is claimed is:

1. A method for providing powerfail durable testing of a memory device having data in a first subset of a plurality of storage locations in the memory device, the method comprising the steps of:

(a) detecting and setting a valid contents status signal in a reserved storage location within the first subset, the valid contents status signal indicative of the validity status of the data in the first subset;

(b) calculating a first checksum for the data in the first subset of storage locations, the first checksum calculated to include the valid contents status signal, and further saving the first checksum to a first reserved test storage location within a second subset of the plurality of locations in the memory device;

(c) copying a first word of the data and its address from a selected target location within the first subset of storage locations to a second and third reserved test storage location, respectively, in the second subset of the plurality of locations in the memory device;

(d) setting a test-status signal in a fourth reserved test storage location within the second subset, the test-status indicative of a memory test in progress for the target location;

(e) testing the target location;

(f) replacing the first word from the second reserved test storage location back to the target location;

(g) resetting the test-status signal in the fourth reserved test storage location, the resetting indicative of completion of the memory test for the target location;

(h) repeating steps (c) through (g) for each word of the data to be tested; and, (i) calculating a second checksum for the data in the first subset of locations, and comparing the second checksum with the first checksum whereby if no match occurs an error is detected and recorded by setting the valid contents status signal accordingly.

2. The method of claim 1 wherein the memory device is selected from the group consisting of (i) a non-volatile memory and (ii) and a memory made non-volatile by a backup power supply.

3. The method of claim 1 wherein the step of setting the test-status signal includes writing a predetermined multiple bit pattern to the fifth reserved test storage location.

4. The method of claim 1 further including, prior to step (b), testing the second subset of storage locations to verify content holding capability of the second subset.

5. The method of claim 1 wherein the step of testing includes content holding testing for the target address by writing and checking a pattern to the target address.

6. The method of claim 1 further including, after step (c), copying a second word and its respective address from a second target location in the first subset to additional, respective reserved test storage locations in the second subset, and after step (d), setting a second test-status signal indicative of a memory test in progress for the second target address, and wherein step (e) includes testing each of the first and second target locations for address bit and decoding operations, and after step (f), restoring the second word to its respective second target location.

7. A method for providing powerfail durable testing of a memory device having data in a first subset of a plurality of storage locations in the memory device, the method comprising the steps of:

(a) calculating a first checksum for the data in the first subset of storage locations, and saving the first checksum to a first reserved test storage location within a second subset of the plurality of locations in the memory device;

(b) setting a checksum-active signal in a second reserved test storage location within the second subset of locations, wherein the checksum-active signal is indicative of the validity of the first checksum;

(c) copying a first word of the data and its address from a elected target location within the first subset of storage locations to a third and fourth reserved test storage location, respectively, in the second subset of the plurality of locations in the memory device;

(d) setting a test-status signal in a fifth reserved test storage location within the second subset the test-status indicative of a memory test in progress for the target location;

(e) testing the target location;

(f) replacing the first word from the third reserved test storage location back to the target location as identified by the address in the fourth reserved test storage location;

(g) resetting the test-status signal in the fifth reserved test storage location, the resetting indicative of a completion of the memory test for the target location;

(h) repeating steps (c) through (g) for each word of the data to be tested;

(i) calculating a second checksum for the data in the first subset of locations, and comparing the second checksum with the first checksum whereby an error is detected if no match occurs; and (j) upon a subsequent testing of the memory device:

(i) detecting whether the test-status signal is set due to a disruption of a prior testing of the memory device; and, (ii) if the test-status signal is set, replacing the first word of data saved in the third reserved test storage location to the target location as identified by the address saved in the fourth reserved test storage location.

8. The method of claim 7 further including, upon the subsequent testing of the memory device, the steps of:

(a) detecting whether the checksum-active signal is set due to a disruption of the prior testing of the memory device; and, (b) if one of (i) the test-status signal and (ii) the checksum-active signal is set, calculating a second checksum for the data in the first subset of locations, and comparing the second checksum with the first checksum whereby an error is detected if no match occurs.

9. A method for providing powerfail durable testing of a non-volatile memory device having a plurality of storage locations, the method comprising the steps of:

(a) calculating a first checksum for data contained in a first subset of the storage locations;

(b) saving the first checksum to a first reserved storage location within a second subset of the plurality of locations;

(c) saving a checksum-active signal to a second reserved storage location within the second subset, the checksum-active signal indicative of the validity status of the first checksum;

(d) testing the plurality of locations in the second subset to verify content holding capability of the locations;

(e) saving a first address associated with a selected first target location in the first subset to a third reserved storage location within the second subset;

(f) copying a first word of the data from the first target location within the first subset to a fourth reserved storage location within the second subset;

(g) setting a first test-status signal in a fifth reserved storage location in the second subset, the test-status indicative of a memory test in progress for the first target location;

(h) testing the first target location;

(i) restoring the first word from the fourth storage location to the first target location;

(j) resetting the first test-status signal, the resetting indicative of the memory test being completed for the first target location;

(k) repeating steps (e) through (j) for each storage location to be tested;

(l) calculating a second checksum for the data contained in the first subset of storage locations; and, (m) comparing the second checksum with the first checksum whereby an error is detected if no match occurs.

10. The method of claim 9 wherein the step of testing includes writing and checking a pattern in the first target location.

11. The method of claim 9 further including, upon a subsequent testing of the memory device, the steps of:

(a) detecting whether the first test-status signal is set due to a disruption of a prior testing of the memory device; and, (b) if the test-status signal is set, replacing the first word of data saved in the fourth storage location to the first target location as identified by the first address saved in the third storage location.

12. The method of claim 11 further including, upon the subsequent testing of the memory device, the steps of:

(a) detecting whether the checksum-active signal is set due to a disruption of the prior testing of the memory device; and, (b) if one of (i) the test-status signal and (ii) the checksum-active signal is set, calculating a second checksum for the data in the first subset of locations, and comparing the second checksum with the first checksum whereby an error is detected if no match occurs.

13. The method of claim 9 further including, after step (f), copying a second word and its respective address from a second target location in the first subset to additional, respective, reserved storage locations in the second subset, and after step (g), setting a second test-status signal indicative of a memory test in progress for the second target location, and wherein step (h) includes testing each of the first and second target locations for address bit and decoding operations, and after step (i), restoring the second word to its respective second target location, and after step (j), resetting the second test-status signal.

14. The method of claim 9 further including setting and detecting a valid contents signal in a reserved storage location within the first subset, the valid contents signal indicative of the validity status of the data in the first subset, and wherein the first checksum is calculated to include the valid contents signal.

* * * * *